(12) United States Patent
Val

(10) Patent No.: US 8,735,220 B2
(45) Date of Patent: May 27, 2014

(54) METHOD FOR POSITIONING CHIPS DURING THE PRODUCTION OF A RECONSTITUTED WAFER

(75) Inventor: Christian Val, St Remy les Chevreuse (FR)

(73) Assignee: 3D Plus, Buc (FR)

( * ) Notice: Subject to any disclaimer, the term of this patent is extended or adjusted under 35 U.S.C. 154(b) by 0 days.

(21) Appl. No.: 13/377,109

(22) PCT Filed: Jun. 14, 2010

(86) PCT No.: PCT/EP2010/058277
§ 371 (c)(1),
(2), (4) Date: Dec. 8, 2011

(87) PCT Pub. No.: WO2010/142804
PCT Pub. Date: Dec. 16, 2010

(65) Prior Publication Data
US 2012/0094439 A1      Apr. 19, 2012

(30) Foreign Application Priority Data
Jun. 12, 2009  (FR) ..................... 09 02871

(51) Int. Cl.
*H01L 21/00*   (2006.01)
(52) U.S. Cl.
USPC ........... 438/113; 438/106; 438/112; 438/127; 257/E23.02
(58) Field of Classification Search
USPC ............... 438/106–127; 257/666–796
See application file for complete search history.

(56) References Cited

U.S. PATENT DOCUMENTS

| | | | | |
|---|---|---|---|---|
| 5,497,033 A * | 3/1996 | Fillion et al. | ................... | 257/723 |
| 5,672,912 A * | 9/1997 | Aoki et al. | ................... | 257/693 |
| 6,154,366 A * | 11/2000 | Ma et al. | ................... | 361/704 |
| 6,744,135 B2 * | 6/2004 | Hasebe et al. | ................... | 257/712 |
| 6,914,500 B2 * | 7/2005 | Hirabayashi | ................... | 333/204 |
| 7,145,231 B2 * | 12/2006 | Hasebe et al. | ................... | 257/712 |
| 7,294,922 B2 * | 11/2007 | Jobetto et al. | ................... | 257/700 |
| 7,297,575 B2 * | 11/2007 | Tago et al. | ................... | 438/118 |
| 7,315,083 B2 * | 1/2008 | Igarashi et al. | ................... | 257/758 |
| 7,763,494 B2 * | 7/2010 | Yang et al. | ................... | 438/106 |
| 7,781,250 B2 * | 8/2010 | Wang et al. | ................... | 438/68 |
| 7,884,015 B2 * | 2/2011 | Sulfridge | ................... | 438/667 |
| 7,927,922 B2 * | 4/2011 | Shen et al. | ................... | 438/114 |
| 8,158,456 B2 * | 4/2012 | Chen et al. | ................... | 438/109 |
| 2002/0135058 A1 * | 9/2002 | Asahi et al. | ................... | 257/687 |

(Continued)

Primary Examiner — Scott B Geyer
Assistant Examiner — Evren Seven
(74) Attorney, Agent, or Firm — Baker Hostetler LLP

(57) ABSTRACT

A method for fabricating a re-built wafer which comprises chips having connection pads, comprising: fabricating a first wafer of chips, production on this wafer of a stack of at least one layer of redistribution of the pads of the chips on conductive tracks designed for the interconnection of the chips, this stack being designated the main RDL layer, cutting this wafer in order to obtain individual chips each furnished with their RDL layer, transferring the individual chips with their RDL layer to a sufficiently rigid support to remain flat during the following steps, which support is furnished with an adhesive layer, with the RDL layer on the adhesive layer, depositing a resin in order to encapsulate the chips, polymerizing the resin, removing the rigid support, depositing a single redistribution layer called a mini RDL in order to connect the conductive tracks of the main RDL layer up to interconnection contacts, through apertures made in the adhesive layer, the wafer comprising the polymerized resin, the chips with their RDL layer and the mini RDL being the re-built wafer.

8 Claims, 2 Drawing Sheets

(56) References Cited

U.S. PATENT DOCUMENTS

| | | | |
|---|---|---|---|
| 2004/0082100 A1* | 4/2004 | Tsukahara et al. | 438/106 |
| 2004/0201085 A1* | 10/2004 | Ogawa et al. | 257/678 |
| 2004/0245614 A1* | 12/2004 | Jobetto | 257/678 |
| 2005/0140007 A1* | 6/2005 | Jobetto | 257/738 |
| 2005/0140021 A1* | 6/2005 | Wakisaka et al. | 257/777 |
| 2005/0161803 A1* | 7/2005 | Mihara | 257/698 |
| 2005/0269698 A1* | 12/2005 | Okada et al. | 257/737 |
| 2006/0046350 A1* | 3/2006 | Jiang et al. | 438/114 |
| 2006/0125082 A1* | 6/2006 | Wakabayashi et al. | 257/698 |
| 2007/0001293 A1* | 1/2007 | Jiang et al. | 257/720 |
| 2007/0042594 A1* | 2/2007 | Wakabayashi et al. | 438/613 |
| 2007/0200217 A1* | 8/2007 | Tsukahara et al. | 257/690 |
| 2008/0014681 A1* | 1/2008 | Jobetto | 438/113 |
| 2008/0166836 A1* | 7/2008 | Jobetto | 438/109 |
| 2009/0039510 A1* | 2/2009 | Jobetto | 257/738 |

* cited by examiner

METHOD FOR POSITIONING CHIPS DURING THE PRODUCTION OF A RECONSTITUTED WAFER

CROSS-REFERENCE TO RELATED APPLICATIONS

This application is a National Stage of International patent application PCT/EP2010/058277, filed on Jun. 14, 2010, which claims priority to foreign French patent application No. FR 0902871, filed on Jun. 12, 2009, the disclosures of which are incorporated by reference in their entirety.

FIELD OF THE INVENTION

The field of the invention is that of the fabrication of re-built wafers which comprise chips encapsulated in a resin, these chips usually having been previously tested.

BACKGROUND

The most widespread solution used for producing a re-built wafer consists first of all in cutting the wafers on which the chips have been fabricated to obtain individual chips, one wafer producing a first type of chips that are identical to one another, another wafer producing another type of chips, etc. A "chip" means an active electronic component such as a bare chip or a passive component (capacitors, resistors, transformers or inductors, etc.) or an MEMS ("Micro Electro Mechanical System"). Usually, these chips are then selected after having been tested and often called "Known Good Die".

Moreover, the support designed to receive the tested chips is prepared: it is an adhesive rigid support.

The various types of tested chips, which have connection pads on a face called the active face or front face, are then picked out and positioned with the front face on the adhesive support by means for example of a "pick-and-place" machine for forming patterns of chips usually similar to one another. A chip pattern is a group of different chips designed to form an electronic element.

Then the chips are moulded in a polymer resin of the epoxy type which is then polymerized in order to render them fixed together.

The adhesive support is then removed.

A step of redistributing the pads of the chips on tracks intended for the future interconnection of the chips is then carried out by forming, on the front face of the chip, a redistribution layer or RDL usually itself comprising a stack of layers; in a known manner, the tracks of this RDL layer which are made of TiW/Cu or of TiPd/Au for example, are formed on a dielectric layer deposited in the place of the adhesive support, by dipping or by centrifuging.

It is possible to summarize these various steps with the following diagram:
1 Cutting the wafer to obtain individual chips
2 Preparing the adhesive rigid support
3 Transferring the cut chips to the adhesive rigid support
4 Moulding the chips in the resin and polymerizing
5 Removing the adhesive support
6 Redistributing the layers on the re-built wafer (RDL).

The wafer thus re-built which contains no defective chips can then be cut into the patterns to obtain plastic micropackages; it can also be stacked onto other re-built wafers and electrically connected to these wafers according to various known methods, the stack then being cut to obtain three-dimensional or 3D electronic modules.

The encapsulation of the chips during step 4 comprises:
a step of depositing the resin (by pouring or by moulding called in compression), around and if necessary over the chips bonded to the adhesive support in order to fill the inter-chip spaces,
a step of polymerizing the resin in order to harden it and thus form a substrate that is rigid and handleable in which the chips are fixed, the adhesive substrate then being able to be removed.

A well-known drawback is the movement of the chips during the depositing of the resin and/or during its polymerization with the result that the pads of the chips will no longer coincide with the tracks of the redistribution layer (RDL layer) during step 6. The micro-movements of the chips relative to the predicted position are due to:
A) the inaccuracy of positioning of the chips on the adhesive support, which is of the order of 5 μm with recent "pick-and-place" equipment operating at high speed,
B) the reversible but very high expansion of the adhesive support in the region of 100 ppm/° C.,
C) the irreversible removal of the resin during polymerization of the order of 1000 ppm/° C.,
D) the irreversible expansion of the resin after polymerization by approximately 16 to 17 ppm/° C.

The result of this is micro-movements that are more or less isotropic and predictable, typically ranging between a few μm and a few tens of μm, which may exceed the tolerances of positioning (relative to the RDL layer) required after moulding, which are typically of the order of 10 μm.

One solution consists in studying and recording these micro-movements in advance and then anticipating them during the positioning of the chips when they are transferred to the adhesive support. One of the limitations of this technique arises from the fact that the micro-movements are not all predictable, notably those of the various types of chips within one and the same pattern.

Another solution consists in modifying the masks used for producing the RDL layer.

SUMMARY OF THE INVENTION

The object of the invention is to alleviate this drawback of movement of the chips when they are moulded in the resin and when this resin is polymerized.

The proposed solution is based on carrying out the step of forming the redistribution layers (RDL layer) before that of moulding the resin, which makes it possible to remove causes B, C and D for the movements of the chips.

More precisely, the subject of the invention is a method for fabricating a re-built wafer which comprises chips having connection pads, this method comprising the following steps of:
fabricating a first wafer of chips, characterized in that it also comprises the following steps:
production on this wafer of a stack of at least one layer of redistribution of the pads of the chips on conductive tracks designed for the interconnection of the chips, this stack being designated the main RDL layer,
cutting this first wafer in order to obtain individual chips each furnished with their RDL layer,
transferring the individual chips with their RDL layer to a sufficiently rigid support to remain flat during the following steps, which support is furnished with an adhesive layer, with the RDL layer on the adhesive layer,
depositing a resin in order to encapsulate the chips,
polymerizing the resin,
removing the rigid support, depositing a single redistribution layer called a mini RDL in order to connect the conductive tracks of the main RDL layer up to interconnection contacts, through apertures made in the adhesive layer, the wafer comprising the chips with their RDL layer, the polymerized resin and the mini RDL being the re-built wafer.

This method makes it possible to keep the chips in the position in which they have been placed during and after their moulding in the resin.

Naturally, the RDL layer that is formed in two steps (main RDL+mini RDL) is not the same as that of the method described in the preamble, but it performs the same function.

It also comprises a step of testing and/or of burning-in of the chips before they are transferred to the rigid support.

According to one feature of the invention, the apertures in the adhesive layer are made before transferring the chips to the rigid support.

According to a variant, the apertures in the adhesive layer are made after the step of removing the support.

BRIEF DESCRIPTION OF THE DRAWINGS

Other features and advantages of the invention will appear on reading the following detailed description, made as a non-limiting example and with reference to the appended drawings in which.

DETAILED DESCRIPTION

Figure 1:
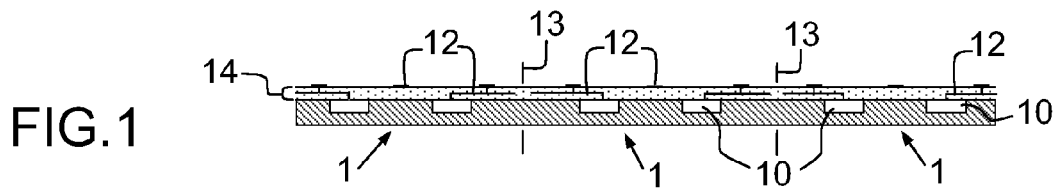
FIG. 1 represents schematically, seen in section, a wafer comprising chips with their RDL layer and ready to be cut.

From one figure to the next, the same elements are indicated by the same reference numbers. Reference number 100 designates the re-built wafer during the various steps of its fabrication.

The method according to the invention is based on the production of a main RDL layer before the chips are moulded in the resin. The steps of the method according to the invention can be summarized in the following diagram:

1 redistribution of the layers (main RDL) on the original wafer (or first wafer) then cutting of the wafer to obtain individual chips
2 preparation of a rigid support with its adhesive layer
3 transfer of the cut chips with their main RDL to this support and its adhesive layer
4 moulding of the chips and polymerization of the resin
5 removal of the support
6 possible etching of the apertures in the adhesive layer
7 redistribution of a single interconnecting layer (mini RDL).

As can be seen, the redistribution of the conductors on the pads of the chips (that is to say the production of the main RDL layer) is carried out at the very beginning on the basic wafers (or first wafers) therefore with the usual precision obtained during the fabrication of the latter. Since the chips are not in the resin but form an integral part of the silicon wafer, there is absolutely no drift of the latter and causes B, C and D of movements do not exist at this stage. This makes it possible to transfer almost totally the complexity of the RDL to the silicon wafer (or first wafer) instead of doing it on the re-built wafer.

This operation of producing the main RDL layer is perfectly controlled and can be carried out by the chip fabricator while in the previous method it was carried out afterwards and therefore by another fabricator who does not necessarily have the same level of equipment.

Finally, causes B, C and D will disappear since the chips will be bonded onto a very thin layer of adhesive itself placed on a rigid support having substantially the same expansion as the resin that will be used.

The various steps will now be described in greater detail.

The step of producing the main RDL layer 14 is a conventional operation. The number of metallic layers varies typically from 1 to 4 for example depending on the complexity of the routing making it possible to trace a conductor 12 from the pad 10 of the chip 1 to the periphery of the latter and which leads to nothing, in the situation in which it is desired subsequently to stack the re-built wafers and interconnect them via the sides, as already described in previous patents. If it is not envisaged to stack these chips as in the case of a two-dimensional (2D) electronic module, the routing does not require tracing all the conductors to the periphery: it is one possibility amongst others.

These conductors 12 conventionally take the form of tracks of virtually constant width over the whole length of the track. The width of these conductors connecting each pad of the chip with the edges of the latter or with other interconnecting pads can be very narrow, for example from 1 to 10 µm, since the main RDL is made on the uncut wafer. An example of such a wafer is shown in FIG. 1. After production of the main RDL 14, the wafers are conventionally cut along cutting paths 13. This step therefore culminates in chips 1 with their main RDL layer 14 which will preferably have been tested by means of spike cards like all chips.

For the step of preparing the support, a material is chosen that makes it possible to obtain a sufficiently rigid support 20 to remain flat when the re-built wafer is polymerized. A material is chosen that has substantially the same coefficient of expansion as the moulding resin and that is easy to eliminate. A metallic material such as copper which can easily be eliminated by being chemically dissolved meets these specifications: it is quite appropriate since it has a coefficient of expansion of 17 ppm/° C. identical to that of the resin. It is also possible to use a Kovar alloy which has a coefficient of expansion of 6 to 7 ppm, or even silicon which has a coefficient of expansion of 3 ppm, or glass.

The support 20 may be circular and have a diameter compatible with the semiconductor equipment equal to 150, 200, 300 mm for example; it may be rectangular or square with dimensions of the same order so that all the operations are collective. The thickness of a copper support is, depending on the surface dimensions, between 75 and 500 µm.

The adhesive 21 is then placed in a thin layer by conventional centrifuging for example, with a thickness of 2 to 10 µm. It is an irreversible-bonding adhesive as opposed to the adhesives of the "bonding skin" type which make it possible to stick and then unstick the chips without damaging them.

The adhesive used is for example of the epoxy type. This deposit can be carried out by syringe or by inkjet or by screen printing or by stencil, or by any other means known to those skilled in the art. Consideration is then given to 2 situations:

The situation of a photosensitive adhesive such as for example "SU8" epoxy resin, having a bonding power before complete polymerization. This material is then photo-etched (for example after UV imaging) after a first heat treatment which makes it pseudo-solid and pasty. After imaging and development, it is etched by laser etching or by plasma etching and apertures are obtained in the desired places.

The situation of an adhesive that is not photosensitive. It is deposited in the same manner over an identical thickness and is pre-polymerized so that it retains its adhesive power. At this stage, the apertures in the adhesive can be made by laser etching or by plasma etching.

Figure 2:
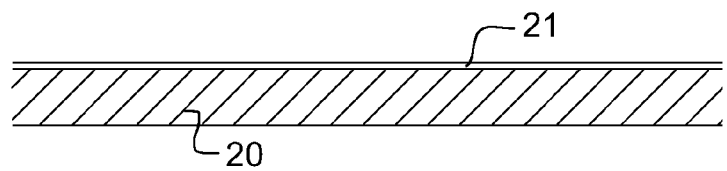
FIG. 2 represents schematically, seen in section, a support with its adhesive layer.

FIG. 2 shows an example on such a support 20 with its adhesive layer 21.

Figure 3:
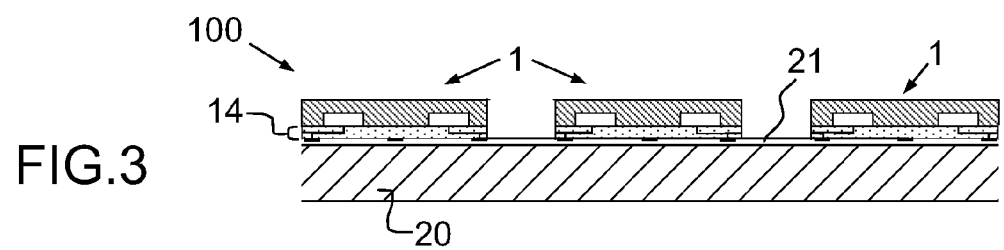
FIG. 3 represents schematically, seen in section, a re-built wafer after transfer of the chips.

The step of transferring to this adhesive support cut chips with their RDL is a conventional operation the result of which is illustrated in FIG. 3. These chips are preferably transferred after having been tested and/or burned-in. As indicated in the preamble, various types of chips can be transferred in order to produce patterns.

The step of moulding the resin 30 (deposited for example by a pouring method) and of polymerization are also conventional operations. Preferably, the temperature of transition of the adhesive 21 should be higher than the polymerization temperature of the moulding resin 30 so as not to lose its properties of holding each chip 1 in position during the polymerization of the moulding resin.

Figure 4A:
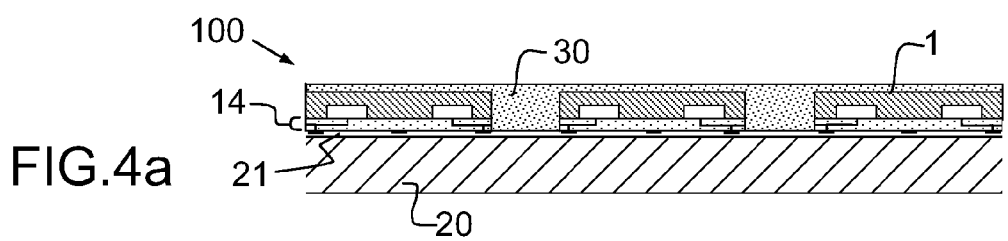
FIG. 4a represents schematically, seen in section, a re-built wafer after moulding of the chips in the resin and polymerization of this resin, FIG. 4b representing this polished wafer.
Figure 4B:
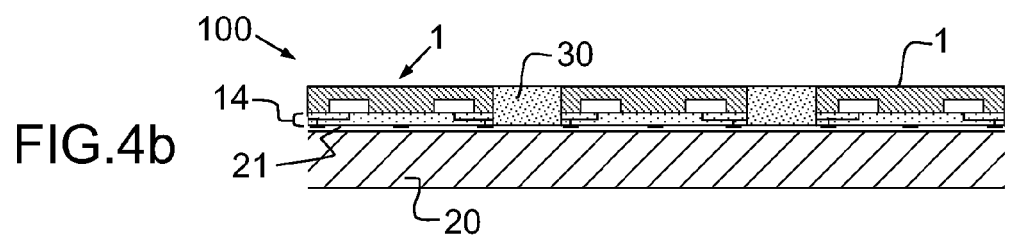

After polymerization, the chips 1 remained positioned in the location determined by the automatic placement and with the precision inherent in the latter, namely approximately 5 μm. The wafer 100 at this stage is shown in FIG. 4a. It is optionally polished in order to be thinned, until the rear face of the chips (that is to say the face without pads) is allowed to appear (as shown in FIG. 4b).

The step of removing the rigid support is for example carried out by chemically dissolving or by abrasion. After moulding, the re-built wafer 100 is perfectly handleable and the chemical dissolving of the copper (if this material has been chosen) is a well known and rapid operation. Note that the thickness of the copper support ranges between 75 and 500 μm.

Figure 5:
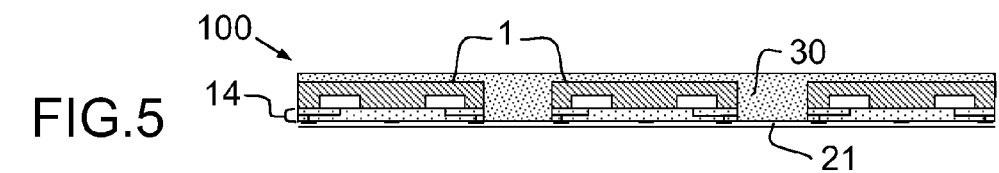
FIG. 5 represents schematically, seen in section, a re-built and polymerized wafer, after removal of the support.

After dissolving, all that remains is the adhesive 21 as can be seen in FIG. 5.

This adhesive 21 optionally has apertures 22 made by photo-etching during the step of preparing the support with adhesive. When the apertures 22 in the adhesive have not been made during preparation of the support with adhesive, since the adhesive 21 used cannot, for example, be photo-etched, they can be made at this stage, according to 2 approaches:

Plasma etching with oxygen so as to "burn" the adhesive 21 in line with the aperture 22 defined by a mask. This technique is used for industrially etching high-definition printed circuits.

Laser-etching by means of a YAG or excimer laser. This method is already used for the fabrication of printed circuits.

The etching of these apertures 22 makes it possible to cause some or all of the conductors 12 connecting the pads 10 of the individual chip with interconnection contacts to reappear; the operation called "mini RDL" can then take place.

Figure 6:
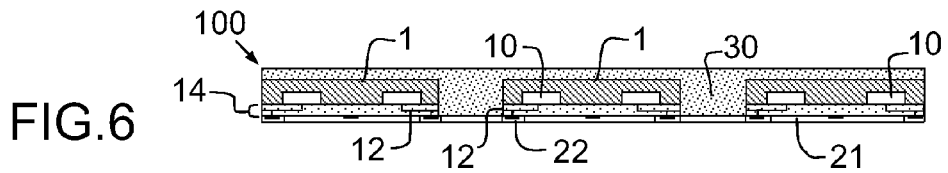
FIG. 6 represents schematically, seen in section, a re-built and polymerized wafer, after removal of the support and production of the apertures in the adhesive.

The wafer 100 obtained after this step is shown in FIG. 6.

Figure 7:
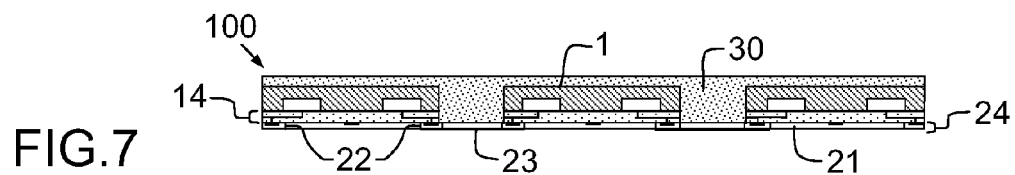
FIG. 7 represents schematically, seen in section, the re-built wafer of FIG. 6 after production of the mini RDL layer.

The step of redistributing a single conductive layer called "mini RDL" 24, the result of which is shown in FIG. 7, is simple to carry out. A single metallic deposit, in copper for example, is sufficient since it involves connecting conductors 12 originating from the main RDL and therefore perfectly positioned with the conductors 23 of this mini RDL in order to bring them to the periphery of the resin surrounding the chips if provision is made to stack them or more generally bring them to the desired interconnection point.

Figure 8:
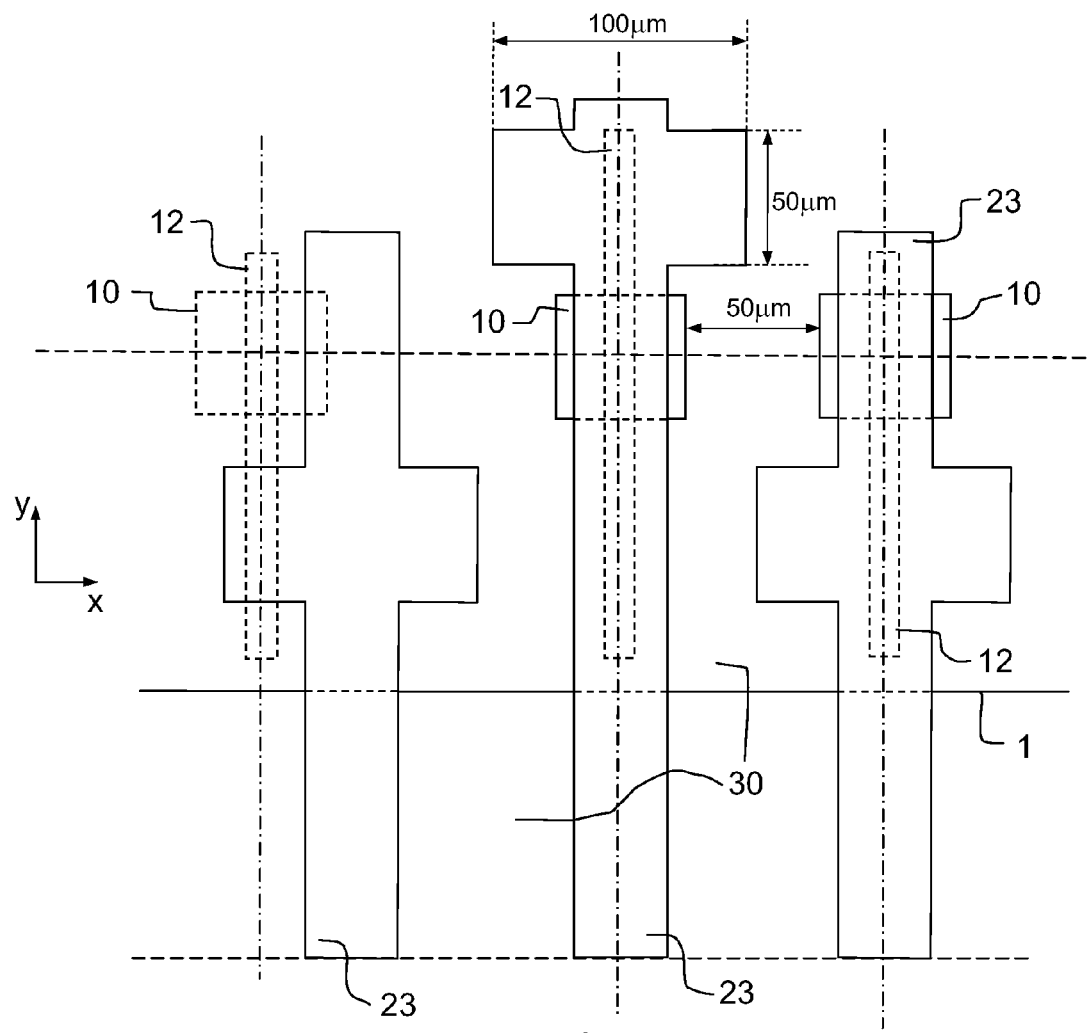
FIG. 8 represents schematically various shapes of conductors.

The shape of these conductors 23 can be adapted to compensate no longer for the movements of the chips due to the differential expansions of the resin and the adhesive layer since they have been removed, but for the slight inaccuracies of positioning of the chips furnished with their main RDL, which has been estimated at approximately 5 μm. As has been seen above, the tracks 12 of the main RDL, called the first tracks, are preferably very thin, with a width ranging between 1 and 10 μm. The tracks 23 of the mini RDL, called second tracks, must totally or partially cover the first tracks. Conductors 23 of greater width (10 to 50 μm) than those of the main RDL are advantageously produced in order to cover the thin conductors 12 originating from the main RDL produced on the wafer. The shape of the conductors also makes it possible to compensate for these positioning variations: FIG. 8 shows shapes appropriate to this type of correction on the X and Y axes, these directions being considered in the plane of the wafer. These involve for example a T shape or a Latin cross shape, the cross bar of the T or of the cross making it possible to establish contact between the first track 12 and the second track 23 even when the other portions are offset as illustrated in the left figure of FIG. 8; the figures in the centre and on the right show the conductors 12 and 23 not offset relative to one another.

This difference in width between the tracks of the main RDL and those of the mini RDL allow a large covering tolerance of these tracks.

In order to produce 3D (three-dimensional) modules, these re-built wafers 100 are stacked and after stacking the conductors 23 are connected vertically by means of known methods.

The re-built wafer 100 can also be cut to obtain two-dimensional micro-packages.

The invention claimed is:
1. A method for fabricating a re-built wafer comprising chips having connection pads, the method comprising:
fabricating a first wafer of chips,
producing, on the first wafer, a stack of at least one layer of redistribution of pads of the chips on conductive tracks joining the pads to an exposed side periphery of the chips and designed for interconnection of the chips, the stack being designated a main RDL layer,
cutting the first wafer to obtain individual chips, each individual chip including its main RDL layer,
transferring the individual chips with their main RDL layer to a sufficiently rigid support to remain flat during the following steps, the rigid support including an adhesive layer, the main RDL layer being over the adhesive layer,
depositing a resin over the individual chips to encapsulate the individual chips,
polymerizing the resin,
removing the rigid support, and
depositing a single redistribution layer designated a mini RDL layer to connect the conductive tracks of the main RDL layer to interconnection contacts through apertures made in the adhesive layer, such that the re-built wafer comprises the polymerized resin and the chips with their main RDL layer and their mini RDL layer.

2. The method for fabricating the re-built wafer according to claim 1, further comprising testing the individual chips before transferring the individual chips to the rigid support.

3. The method for fabricating the re-built wafer according to claim 1, wherein the apertures in the adhesive layer are made before transferring the individual chips to the rigid support.

4. The method for fabricating the re-built wafer according to claim 1, wherein the apertures in the adhesive layer are made after removing the rigid support.

5. The method for fabricating the re-built wafer according to claim 1, wherein conductors of the mini RDL layer are in the form of a T or a Latin cross.

6. The method for fabricating the re-built wafer according to claim 1, wherein the adhesive layer is made of an irreversible bonding material.

7. The method for fabricating the re-built wafer according to claim 1, further comprising burning-in the individual chips before transferring the individual chips to the rigid support.

8. The method for fabricating the re-built wafer according to claim 1, wherein the exposed side periphery of the chips is perpendicular to the stack of the at least one layer of redistribution of pads of the chips.

* * * * *